United States Patent [19]

Dykstra et al.

[11] Patent Number: 4,514,637
[45] Date of Patent: Apr. 30, 1985

[54] ATOMIC MASS MEASUREMENT SYSTEM

[75] Inventors: Jerald P. Dykstra; Brad L. Bellamy, both of Austin, Tex.

[73] Assignee: Eaton Corporation, Cleveland, Ohio

[21] Appl. No.: 469,184

[22] Filed: Feb. 24, 1983

[51] Int. Cl.³ ............................................. G01N 23/00
[52] U.S. Cl. .................................. 250/492.2; 250/299; 250/397
[58] Field of Search .................... 250/299, 492.2, 398, 250/397; 324/257, 253

[56] References Cited

U.S. PATENT DOCUMENTS

| | | | |
|---|---|---|---|
| 2,964,627 | 12/1960 | Wild | 250/299 |
| 3,342,991 | 9/1967 | Kronenberger | 250/299 |
| 3,397,358 | 8/1968 | Allenden et al. | 324/257 |
| 4,256,963 | 3/1981 | Takahashi et al. | 250/281 |
| 4,320,340 | 3/1982 | Lichtenberg | 324/253 |

Primary Examiner—Alfred E. Smith
Assistant Examiner—Richard Hanig
Attorney, Agent, or Firm—C. H. Grace; F. M. Sajovec

[57] ABSTRACT

An apparatus and method for measuring the atomic mass of ion species selected by the analyzing magnet (14) of an ion implanter (10). A signal proportional to the magnetic field of the analyzing magnet is obtained by means of a rotating coil (36), and this signal is used to calculate the atomic mass by means of the equation: Atomic Mass = $KB^2/V$ where B is the magnetic field, V is the ion beam energy at the analyzing magnet, and K is a proportionality constant. The rotating coil (36) is driven by a synchronous motor (38) powered by A.C. line voltage, and the output voltage is converted to a frequency signal proportional to the magnetic field and the line frequency. The frequency signal is counted over a time corresponding to the period of the line frequency to cancel out the line frequency dependence of the frequency signal. In accordance with one embodiment of the invention, a microprocessor is utilized to evaluate the B and V signals and to calculate the atomic mass.

5 Claims, 5 Drawing Figures

ATOMIC MASS MEASUREMENT SYSTEM

The present invention relates generally to ion implantation apparatus, and more specifically to a system for measuring the atomic mass of an ion beam selected for use in such apparatus.

In an ion implantation apparatus used in the production of semiconductor wafers it is useful to be able to measure and display the mass of the particles which are being selected by the ion beam analyzing magnet. Since the ion beam energy at the analyzing magnet (beam energy) is a system parameter which is normally measured in a typical ion implanter, the mass of the particles analyzed can be determined using the equation:

TI $AMU = KB^2/V$ where AMU=atomic mass units, B=magnetic field of the analyzing magnet, V=beam energy, and K is a proportionality constant dependent on physical characteristics of the analyzing magnet and the charge on the ions.

Accordingly, what is needed to complete the AMU measurement is a measurement of the magnetic field. While devices and circuitry which are capable of magnetic field measurement are commercially available, these are generally not sufficiently accurate, or do not have sufficient linearity for the accuracy required in an ion implantation application.

It is thus an object of this invention to provide a means to accurately measure the mass of the ions generated and analyzed in an ion implanter, and more particularly to provide an accurate and reliable means for measuring the magnetic field of the analyzing magnet of the ion implanter to provide the information necessary to compute the mass of the ions based on the above relationship.

Other objects and advantages of the invention will be apparent from the following description when considered in view of the accompanying drawing, wherein.

Figure 1:
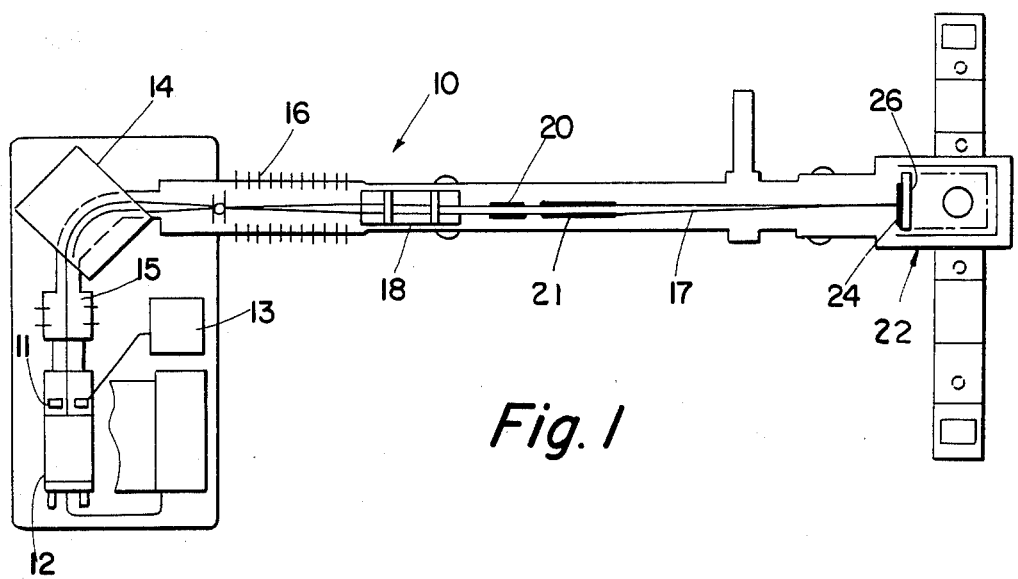
FIG. 1 is a schematic view of an ion implantation apparatus.

Referring to FIG. 1, there is illustrated an ion implantation apparatus 10. Ions are extracted from an ion source 12 by extraction electrodes 11 powered by extraction power supply 13. Said ions may then be accelerated by a pre-analysis accelerator column 15 energized with an acceleration voltage. The ions are then redirected by an analyzing magnet 14 before being directed through a post-analysis accelerator column 16 to impart additional energy to the beam. The ion beam 17 then passes through a lens system 18, and past a series of scan plates 20 and 21 before entering an end station 22 where a target wafer 24 is received on a support member 26. It should be noted that a typical ion implanter may utilize either a pre-analysis accelerator column or a post-analysis accelerator column, or both. If a pre-analysis accelerator is present, the beam energy V at the analyzing magnet is determined by measuring the sum of the extraction voltage and the pre-analysis acceleration voltage. If a pre-analysis accelerator is not present, the beam energy V is determined by measuring the extraction voltage. The presence or absence of a post-analysis accelerator influences the beam energy at the target wafer 24, but not at the analyzing magnet 14. For purposes of the following description, post-analysis acceleration without pre-analysis acceleration is assumed. The ion implantation apparatus 10 per se is well known in the art and will not be described in further detail herein.

Figure 2:
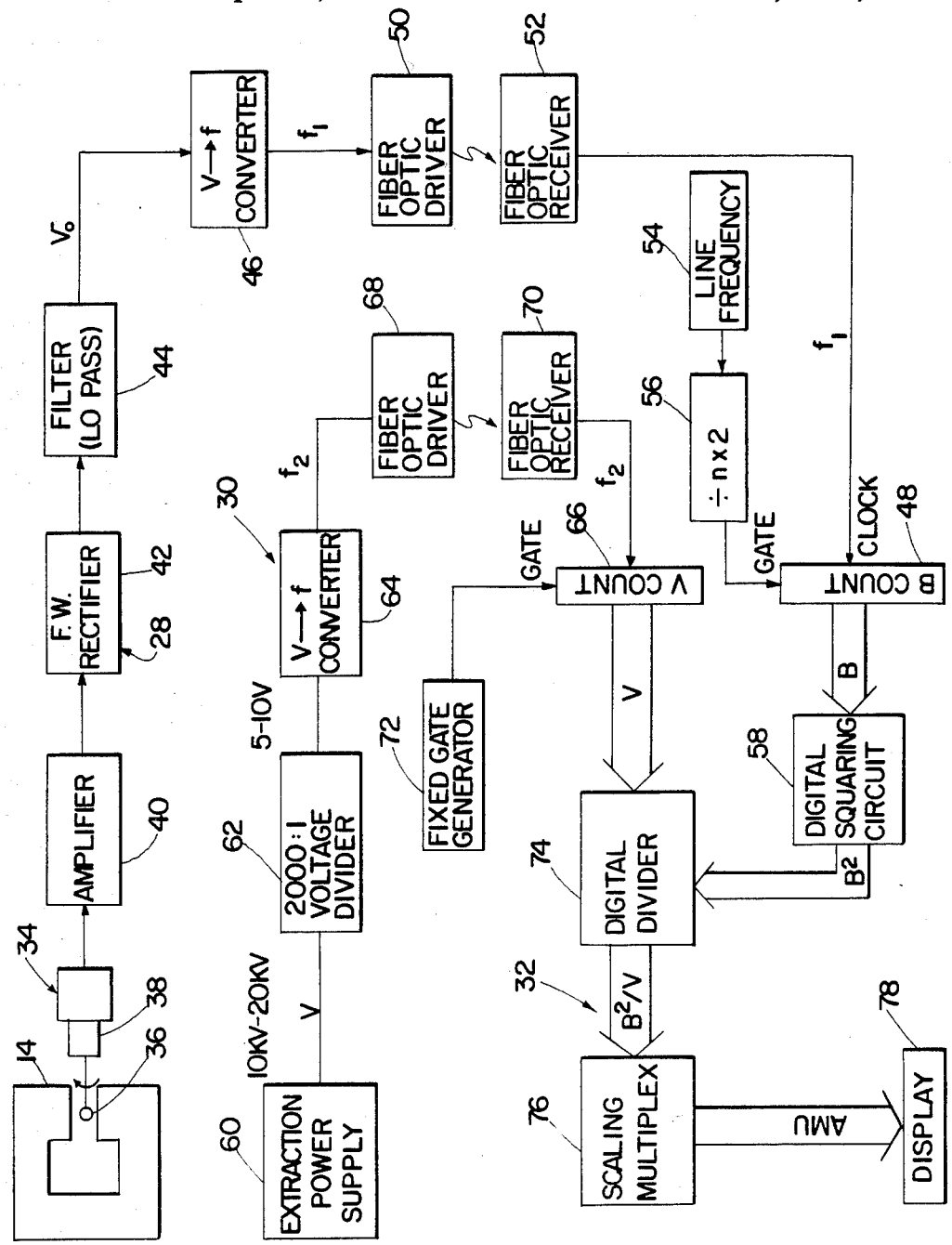
FIG. 2 is a block diagram of a system for measuring the mass of the ions generated and analyzed in apparatus of the type shown in FIG. 1.

Referring to FIG. 2, there is illustrated a block diagram of a system for measuring the atomic mass of the particles in the ion beam 17 of the ion implantation apparatus 10. The system essentially comprises a first subsystem 28 for generating a signal representing the strength of the magnetic field of the analyzing magnet 14, a second subsystem 30 for generating a signal representing the beam energy of the ion implantation system, and a third subsystem 32 for combining these signals to provide a direct readout of atomic mass units.

The strength of the field of the analyzing magnet 14 is measured by a rotating coil gaussmeter 34, wherein a coil probe element 36 is rotated within the field of the analyzing magnet to produce an output voltage which is proportional to the product of B and $\omega$, wherein B is the field strength and $\omega$ is the frequency of the line voltage.

From the above, it can be appreciated that the gaussmeter output is sensitive to fluctuation in the angular velocity of the coil. As a result, commercially available gaussmeters having the accuracy required for the measurement of atomic mass units use synchronous motors which are driven by a stabilized frequency source; however, this requires expensive and bulky instrumentation which is not considered to be practical for the present application. Accordingly, it was decided to use a synchronous motor 38 powered by line voltage, and thus turning the coil 36 at a rate which is locked to the line frequency. While line frequency in the United States is closely regulated, it is possible to have short term fluctuations on the order of 1%, which would result in unacceptable errors in field measurement. Also, there may be variations in the magnetic field or angular variations due to friction in the motor which will cause the wave shape of the output voltage to include harmonics of $\omega$.

The output of a device such as the rotating coil 36 is generally full wave rectified and filtered to obtain a d.c. voltage $v_o$ which is proportional to the average value of B; however, as a practical matter the filtered d.c. voltage will include some ripple including harmonics and sub-multiples of $\omega$, circuit noise, and the variations in the normal 60 HZ line frequency which will cause the measured value of B to vary depending upon when in the cycle of $\omega$ the data is sampled.

In accordance with the invention, the output voltage is converted to a frequency which is instantaneously proportional to $v_o$ by means of a voltage-to-frequency converter.

Figure 3:
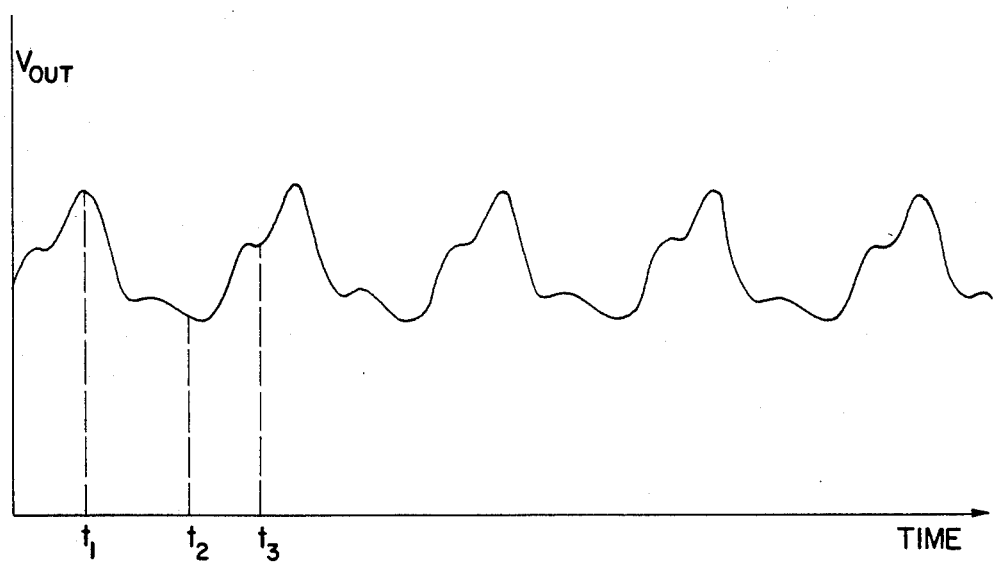
FIG. 3 is a graph illustrating the variations of the output voltage of the gaussmeter of the invention with time.
Figure 4:
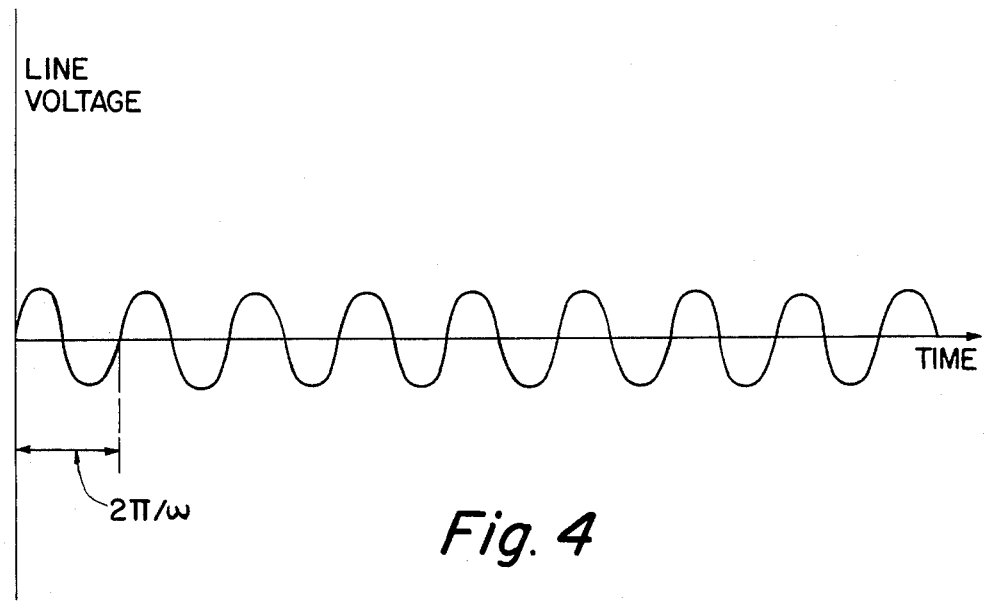
FIG. 4 is a graph illustrating the variation of line voltage with time.

As illustrated in FIG. 3 the average value of $v_o$ represents the average value of B; however, it can be seen that samples taken at times t, $t_2$ and $t_3$ all give different measures of that value. If, however, $v_o$ is converted to a frequency instantaneously proportional to $v_o$ by means of a voltage-to-frequency converter and the number of cycles of the frequency occurring in the time period $2\pi/\omega$ or an integral multiple thereof is counted as illustrated in FIG. 4, the result will be a count proportional to the average value of $v_o$ and thus of B. The counter gate signal, if of duration $(n2\pi/\omega$ $(n=1,2,3,\ldots)$, causes an averaging of all frequency components in the waveform which are harmonics of $\omega$. This averaging is analogous to performing a mathmatical integral over the range $t=0$ to $(n2\pi/\omega$, the value of which integral is zero for all frequency components which are harmonics of $\omega$. If the counter gate period is made equal to an integral number of line frequency cycles the counter gating function exactly compensates for variation in the probe output due to changes or differences in $\omega$.

Since the gaussmeter output is proportional to $B\omega$, and the accumulated count will be proportional to $(n2\pi/\omega$ then:

$$\text{accumulated count } \alpha \left( \frac{n2\pi}{\omega} \times B\omega \right) \alpha B$$

and the system will be exactly compensated for drifts and variations in $\omega$ and will yield the same measurement of B whether $\omega/2\pi$ is 50 HZ, 60 HZ or any other frequency.

Furthermore, the system will reject periodic noise which is synchronous with $\omega$ or harmonics thereof and will effectively reject asynchronous noise with increasing effect as the counter gate period is increased. While the periodic noise rejection capabilities of counting or integrating type data converters is well known, when such a system is used in the synchronous motor drive for the rotating coil probe 36, noise rejection is achieved while simultaneously compensating for variations in the coil speed. An added benefit is that the resulting data is digital, thus facilitating the computations for calculating AMU.

FIG. 2 illustrates a system for determining AMU utilizing the above concept.

The probe 36 of the rotating coil gaussmeter 34 is rotated within the air gap of analyzing magnet 14 by means of a synchronous motor 38. The voltage output ($v_o$) from the gaussmeter is amplified by means of an amplifier 40, rectified by means of full wave rectifier 42, and filtered by means of a low pass filter 44. The resulting voltage output, which will be in the form illustrated in FIG. 3 is then directed to a voltage-to-frequency converter 46.

In order to further reduce noise in the system, the frequency signal $f_1$ representative of B is transitted to a first counter by means of a fiber optic driver 50 and a fiber optic receiver 52; however, it can be appreciated that direct wiring can also be used in many applications in which additional noise reduction or voltage isolation is not required.

The counter 48 for the field strength frequency signal B is gated by a signal which is high (or low) for some integer multiple of the line frequency as discussed above; therefore, the gate signal at the counter 48 is provided by taking a line frequency signal at 54, dividing it by $n \times 2$ means of divider circuit 56, then providing a gating signal of duration $(n2\pi/\omega$ to the counter 48 to yield an output signal which is proportional to the average field strength B over that time period.

Since the ultimate computation of AMU is obtained from the relationship $AMU = KB^2/V$, the B signal is inputted to a digital squaring circuit 58.

The beam energy signal V required for the above relationship is readily obtainable fro the voltage of the extraction power supply 60 of the ion implanter. To obtain a signal representative of the extraction voltage and thus representative of the beam energy a signal from the power supply, which operates at 10 KV to 20 KV is directed to a 2,000 to 1 voltage divider circuit 62 to reduce the voltage signal to the 5–10 volt range, and this voltage signal is converted to a frequency signal $f_2$ by means of a voltage-to-frequency converter 64 and then inputted to a second counter 66 via a fiber optic driver 68 and a fiber optic receiver 70. As discussed above with regard to the B signal, the fiber optic data link is optional depending on the specific need for enhanced noise reduction or voltage isolation.

The extraction voltage count is gated by means of a fixed gate generator 72, yielding an output signal which is proportional to the beam energy V. This signal, along with the B signal is inputted to a digital divider circuit 74 which yields a signal which is proportional to $B^2/V$. This signal is then inputted to a scaling multiplier circuit 76 which applies the proportionality constant K so that the output signal provides a direct measurement of AMU in accordance with the equation $AMU = KB^2/V$, which can then be displayed by means of a suitable digital display 78.

Figure 5:
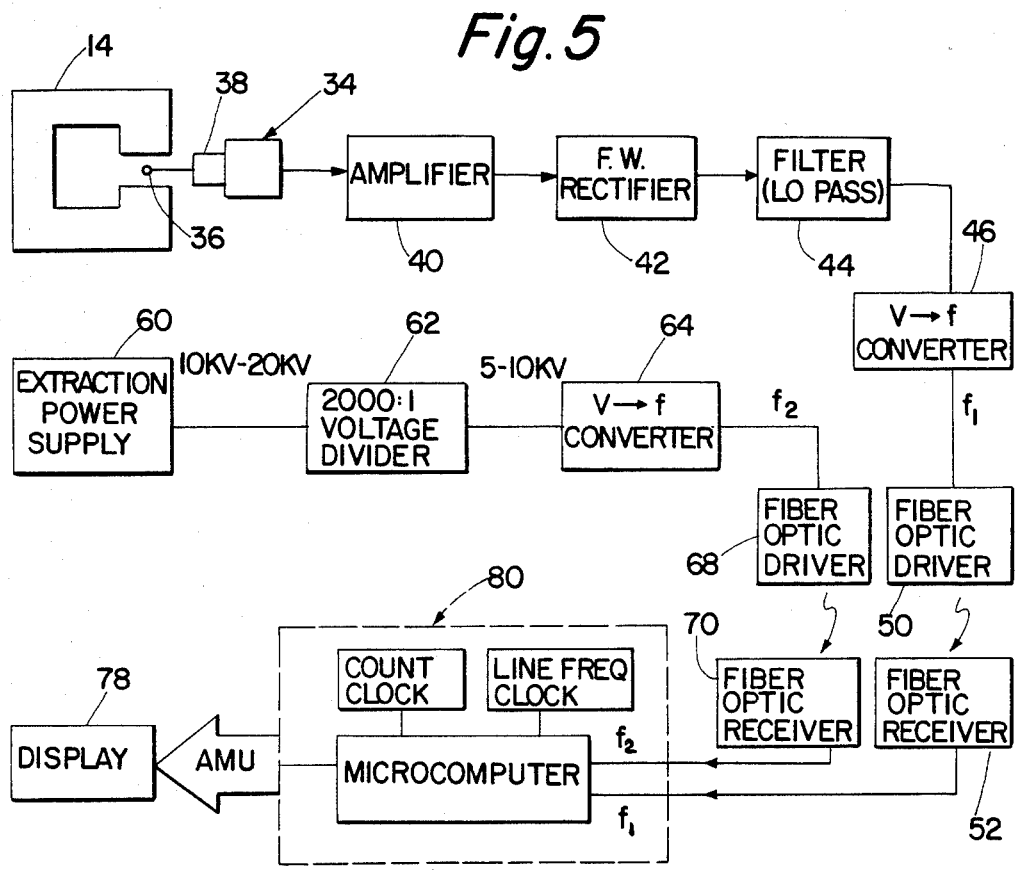
FIG. 5 is a block diagram of an alternate embodiment of the measuring system.

Referring to FIG. 5, there is illustrated an alternative embodiment of the invention. This embodiment is essentially the same as the FIG. 2 embodiment; however, the counters 48 and 66, the squaring circuit 58, the digital divider 74 and the scaling multiplier 76 are replaced by a microprocessor 80.

In the microprocessor, the frequency corresponding to B is counted during 128 line frequency cycles. This count period is sufficiently long to minimize the effect of noise, but not so long as to cause significant delays in the AMU value readout. The B count is then:

$B \text{ Count} = f_1/f_{line} \times 128$

Where $f_{line}$ is the line frequency and $f_1$ is a frequency proportional to B and to the line frequency. This line-frequency-independent count is used in the calculation of the AMU.

To get a count corresponding to V the same method is used at first to reject any noise that may be present at the line frequency or its harmonics and:

$V \text{ Count} = f_2/f_{line} \times 128$

Where $f_{line}$ is the line frequency and $f_2$ is a frequency proportional to V. Since the V count must be proportional to V and must also be independent of the line frequency, an adjustment to V count is made using a count of a known frequency during an integral number of line cycles:

$E \text{ Count} = f_{MPU}/f_{line} \times 13$

Where $f_{line}$ is the line frequency and $f_{MPU}$ is the constant frequency at which the microprocessor counts. Thirteen is the integer number of line cycles during which the count is performed. The value 13 is chosen to provide the maximum resolution in measured line frequency consistent with convenient data storage requirements. The calculation to get the adjusted line-frequency-independent V count is then:

$$V\ \text{Count}_{final} = [V\ \text{Count}/E\ \text{Count}] \times \frac{13}{128} \times f_{MPU} \times K_1 =$$

$$\frac{f_2}{f_{line}} \times \frac{f_{line}}{f_{MPU}} \times \frac{128}{13} \times f_{MPU} \times \frac{13}{128} \times K_1 =$$

$$f_2 \times K_1$$

When $K_1$ is a scaling constant chosen such that:

$$\frac{K_1\ (B\ \text{Count})^2}{V\ \text{Count}_{final}} = \frac{B^2}{V}$$

The AMU is then calculated using the line-frequency-independent B count and the line-frequency-independent V count in the relationship:

$$AMU = K \frac{K_1\ (B\ \text{Count})^2}{V\ \text{Count}_{final}} = K \frac{B^2}{V}$$

We claim:

1. In an ion implanter including an extraction power supply, an ion source, an analyzing magnet operable to select certain ion species emanating from the source for implantation, a rotation coil for generating a first electrical signal proportional to the magnetic field of the analyzing magnet, means for generating a second electrical signal proportional to the beam energy at the analyzing magnet, calculating means performing calculations on the first and second signals to determine the atomic mass of the selected ion species, and indicating means for providing a visual display of said atomic mass, the improvement wherein: said rotating coil is driven by a synchronous motor powered by A.C. line voltage; and including means converting said first electrical signal to a first frequency signal, and means for counting said first frequency signal over a time corresponding to the period of the line frequency to provide a first digital count to said calculating means which is proportional to the magnetic field of said analyzing magnet independent of the line frequency.

2. Apparatus as claimed in claim 1, including means for converting said second electrical signal to a second frequency signal, means gating the second frequency to provide a second digital count to said calculating means which is proportional to the beam energy at the analyzing magnet, said circuit means being operable to provide a calculation which is proportional to the square of the magnetic field strength divided by the beam energy to yield a signal which is proportional to the atomic mass of the selected ion species.

3. Apparatus as claimed in claim 2, wherein said first and second frequency signals are transmitted by means of fiber optic data links.

4. Apparatus as claimed in claim 1 including a microprocessor to which said first signal is inputted, said microprocessor including means counting said first frequency over a predetermined number of line frequency cycles.

5. Apparatus as claimed in claim 4, in which said microprocessor includes means counting said second frequency over a predetermined number of line frequency cycles, and means for adjusting said second frequency count to provide a second frequency signal proportional to the beam energy at the analyzing magnet and independent of the line frequency.

* * * * *